(12) United States Patent
Woo et al.

(10) Patent No.: US 11,773,253 B2
(45) Date of Patent: Oct. 3, 2023

(54) ENCAPSULATING COMPOSITION

(71) Applicant: LG CHEM, LTD., Seoul (KR)

(72) Inventors: Yu Jin Woo, Daejeon (KR); Joon Hyung Kim, Daejeon (KR); Kook Hyun Choi, Daejeon (KR); Mi Lim Yu, Daejeon (KR)

(73) Assignee: LG Chem, Ltd., Seoul (KR)

( * ) Notice: Subject to any disclaimer, the term of this patent is extended or adjusted under 35 U.S.C. 154(b) by 18 days.

(21) Appl. No.: 16/467,009

(22) PCT Filed: Dec. 11, 2017

(86) PCT No.: PCT/KR2017/014485
§ 371 (c)(1),
(2) Date: Jun. 5, 2019

(87) PCT Pub. No.: WO2018/106092
PCT Pub. Date: Jun. 14, 2018

(65) Prior Publication Data
US 2019/0309160 A1   Oct. 10, 2019

(30) Foreign Application Priority Data

Dec. 9, 2016 (KR) .................. 10-2016-0167794
Jul. 3, 2017 (KR) .................. 10-2017-0084291

(51) Int. Cl.
*C08L 63/00* (2006.01)
*C08K 5/1525* (2006.01)
(Continued)

(52) U.S. Cl.
CPC .............. *C08L 63/00* (2013.01); *C08G 59/22* (2013.01); *C08K 5/1525* (2013.01);
(Continued)

(58) Field of Classification Search
CPC ................ C08K 5/1525; C09D 11/101; C08L 63/00–10; C08D 163/00–10
See application file for complete search history.

(56) References Cited

U.S. PATENT DOCUMENTS 3,457,193 A * 7/1969 King .................... C08G 65/18
528/73
6,586,496 B1   7/2003 Takamatsu et al.
(Continued)

FOREIGN PATENT DOCUMENTS

CN   001604411   4/2005
CN   1203150     5/2005
(Continued)

OTHER PUBLICATIONS

Partial machine translation of JP-2016040365-A (2016).*
(Continued)

*Primary Examiner* — Kregg T Brooks
(74) *Attorney, Agent, or Firm* — Bryan Cave Leighton Paisner LLP (57) ABSTRACT

Provided is an encapsulating composition and an organic electronic device comprising the same. The encapsulating composition can effectively block moisture or oxygen from being introduced into an organic electronic device from the outside. The encapsulating composition can secure the lifetime of the organic electronic device, make it possible to realize a top emission type organic electronic device, is applicable to an inkjet method and can provide a thin display.

9 Claims, 1 Drawing Sheet

(51) Int. Cl.
*C09D 11/101* (2014.01)
*C09D 11/102* (2014.01)
*C08G 59/22* (2006.01)
*H10K 50/80* (2023.01)
*H10K 50/842* (2023.01)
*H10K 59/00* (2023.01)
*H10K 99/00* (2023.01)

(52) U.S. Cl.
CPC .......... *C09D 11/101* (2013.01); *C09D 11/102* (2013.01); *H10K 50/80* (2023.02); *H10K 50/8426* (2023.02); *H10K 59/00* (2023.02); *H10K 99/00* (2023.02); *C08L 2203/206* (2013.01); *C08L 2205/025* (2013.01)

(56) References Cited

U.S. PATENT DOCUMENTS

| | | | |
|---|---|---|---|
| 2003/0064228 A1* | 4/2003 | Oosedo | C08J 3/244 428/413 |
| 2005/0020717 A1* | 1/2005 | Sasa | C09D 11/101 522/170 |
| 2012/0027342 A1* | 2/2012 | Yoshida | G02B 6/02033 385/14 |
| 2013/0090407 A1* | 4/2013 | Carter | C08G 59/68 522/170 |
| 2017/0198157 A1* | 7/2017 | Park | B41M 7/00 |
| 2017/0227844 A1* | 8/2017 | Park | G03F 7/038 |
| 2018/0134838 A1 | 5/2018 | Fujikawa et al. | |

FOREIGN PATENT DOCUMENTS

| | | |
|---|---|---|
| CN | 101155853 | 4/2008 |
| CN | 103154130 | 6/2013 |
| EP | 1700890 B1 | 8/2011 |
| JP | H09-087363 | 3/1997 |
| JP | 2001-139933 | 5/2001 |
| JP | 2002-060483 | 2/2002 |
| JP | 2002317139 A * | 10/2002 |
| JP | 2005-008760 | 1/2005 |
| JP | 2005206653 A * | 8/2005 |
| JP | 2007-169337 | 7/2007 |
| JP | 2008-063397 | 3/2008 |
| JP | 2009263599 A * | 11/2009 |
| JP | 2010-280876 | 12/2010 |
| JP | 2011111598 A * | 6/2011 |
| JP | 2012054060 A * | 3/2012 |
| JP | 2014-225380 | 12/2014 |
| JP | 2016-027124 | 2/2016 |
| JP | 2016040365 A * | 3/2016 |
| KR | 10-2005-0109500 | 11/2005 |
| KR | 10-1048603 | 7/2011 |
| KR | 10-2011-0095172 | 8/2011 |
| KR | 10-2012-0087998 | 8/2012 |
| KR | 10-1378817 | 3/2014 |
| KR | 10-2015-0090063 | 8/2015 |
| KR | 10-2016-0011228 | 1/2016 |
| KR | 10-2016-0037122 | 4/2016 |
| KR | 10-2016-0048795 | 5/2016 |
| WO | 2006/107803 | 10/2006 |
| WO | 2006-107803 | 10/2006 |
| WO | WO-2015053397 A1 * | 4/2015 ............... C09D 5/44 |
| WO | WO-2016048116 A1 * | 3/2016 ........... C09D 11/101 |
| WO | WO-2016093672 A1 * | 6/2016 ................ C07F 7/02 |
| WO | 2016/190300 | 5/2018 |

OTHER PUBLICATIONS

Partial machine translation of JP 2001-139933 A (2001).*
Partial machine translation of JP 2005-008760 A (2005).*
Partial machine translation of JP 2014-225380 A (2014).*
Daicel Epolead PB3600 Product Data Sheet (no date).*
Scifinder Properties of CAS 483303-25-9 (2020).*
Partial machine translation of JP-2002317139-A (2002).*
Partial machine translation of JP-2011111598-A (2011).*
Partial machine translation of JP-2009263599-A (2009).*

* cited by examiner

ENCAPSULATING COMPOSITION

CROSS-REFERENCE TO RELATED APPLICATIONS

This application is a National Stage Application of International Application No. PCT/KR2017/014485 filed on Dec. 11, 2017, which claims the benefit of priority based on Korean Patent Application No. 10-2016-0167794 filed on Dec. 9, 2016, and Korean Patent Application No. 10-2017-0084291 filed on Jul. 3, 2017, the disclosures of which are incorporated herein by reference in their entirety.

TECHNICAL FIELD

The present application relates to an encapsulating composition, an organic electronic device comprising the same, and a method for manufacturing the organic electronic device.

BACKGROUND ART

An organic electronic device (OED) means a device comprising a layer of an organic material that generates an alternating current of electric charges using holes and electrons, and an example thereof can include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application provides an encapsulating composition which can effectively block moisture or oxygen introduced into an organic electronic device from the outside to secure the lifetime of the organic electronic device, is possible to realize a top emission type organic electronic device, is applicable to an inkjet method and can provide a thin display, and an organic electronic device comprising the same.

Technical Solution

The present application relates to an encapsulating composition. The encapsulating composition can be a sealing material applied to sealing or encapsulating an organic electronic device such as, for example, an OLED. In one example, the encapsulating composition of the present application can be applied to sealing or encapsulating the entire surface of an organic electronic element. Thus, after the encapsulating composition is applied to the encapsulation, it can be present in an organic layer form sealing the entire surface of the organic electronic element. In addition, the organic layer can be laminated on the organic electronic element together with a protective layer and/or an inorganic layer, which is described below, to form a sealing structure.

In an embodiment of the present application, the present application relates to an encapsulating composition for sealing an organic electronic element which is applicable to an inkjet process, wherein the composition can be designed to have appropriate physical properties when it has been discharged onto a substrate using inkjet printing capable of non-contact patterning.

In this specification, the term "organic electronic device" means an article or device having a structure comprising an organic material layer that generates an alternating current of electric charges using holes and electrons between a pair of electrodes facing each other, and an example thereof can include a photovoltaic device, a rectifier, a transmitter and an organic light emitting diode (OLED), and the like, but is not limited thereto. In one example of the present application, the organic electronic device can be an OLED.

An exemplary encapsulating composition can comprise an epoxy compound and a compound having an oxetane group. The epoxy compound can be a photo-curable or thermosetting compound. The compound having an oxetane group can be present in an amount of 45 to 145 parts by weight, 48 to 144 parts by weight, 63 to 143 parts by weight or 68 to 142 parts by weight, relative to 100 parts by weight of the epoxy compound. In this specification, the term "part by weight" can mean a weight ratio between the respective components. By controlling the content ratio of the composition, the present application can form an organic layer on an organic electronic element by an ink jet method, and the applied encapsulating composition can provide an organic layer having excellent spreadability in a short time and excellent curing sensitivity after curing. In addition, the encapsulating composition can comprise a photoinitiator comprising an iodonium salt. In particular, the encapsulating composition can realize excellent adhesive strength and curing sensitivity as well as processability as an ink composition, together with the epoxy compound and the oxetane group-containing compound in the above-mentioned specific content ratio.

In one example, the epoxy compound can have at least bifunctionality or more. That is, two or more epoxy functional groups can be present in the compound. The epoxy compound exhibits excellent heat resistance durability at high temperature and high humidity by realizing an appropriate cross-linking degree in a sealing material.

In an embodiment of the present application, the epoxy compound can comprise a compound having a cyclic structure in its molecular structure and/or a linear or branched aliphatic compound. That is, the encapsulating composition of the present application can comprise at least one of a compound having a cyclic structure in its molecular structure and a linear or branched aliphatic compound as the epoxy compound, and can also comprise them together. In one example, the compound having a cyclic structure in the molecular structure can have ring constituent atoms in the molecular structure in a range of 3 to 10, 4 to 8, or 5 to 7, and two or more, or 10 or less of the cyclic structures can be present in the compound. When the compound having a cyclic structure and the linear or branched aliphatic compound are included together, the linear or branched aliphatic compound can be present in a range of 20 parts by weight or more, less than 205 parts by weight, 23 parts by weight to 204 parts by weight, 30 parts by weight to 203 parts by weight, 34 parts by weight to 202 parts by weight, 40 parts by weight to 201 parts by weight, 60 parts by weight to 200 parts by weight or 100 parts by weight to 173 parts by weight, relative to 100 parts by weight of the compound having a cyclic structure. By controlling the content range, the present application makes it possible to prevent element damage in top sealing the organic electronic element, to have appropriate physical properties that can be ink-jetted, to have excellent curing strength after curing, and also to realize excellent moisture barrier properties together.

In one example, the epoxy compound can have an epoxy equivalent in a range of 50 to 350 g/eq, 73 to 332 g/eq, 94 to 318 g/eq or 123 to 298 g/eq. In addition, the compound having an oxetane group can have a weight average molecular weight in a range of 150 to 1,000 g/mol, 173 to 980 g/mol, 188 to 860 g/mol, 210 to 823 g/mol or 330 to 780 g/mol. By controlling the epoxy equivalent of the epoxy compound to be low or controlling the weight average molecular weight of the compound having an oxetane group to be low, the present application can prevent the viscosity of the composition from becoming excessively high to render the inkjet process impossible, while improving the curing completion degree after curing of the sealing material, and simultaneously provide moisture barrier properties and excellent curing sensitivity. In this specification, the weight average molecular weight means a value converted to standard polystyrene measured by GPC (gel permeation chromatograph). In one example, a column made of a metal tube having a length of 250 to 300 mm and an inner diameter of 4.5 to 7.5 mm is filled with 3 to 20 mm polystyrene beads. When a solution diluted by dissolving a substance to be measured in a THF solvent is passed through the column, the weight average molecular weight can be indirectly measured according to a flowing time. It can be detected by plotting amounts separated from the column by size for each time. Also, the epoxy equivalent herein is grams (g/eq) of a resin containing one gram equivalent of epoxy group, which can be measured according to the method defined in JIS K 7236.

The compound having an oxetane group can have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point can be measured at 1 atm, unless otherwise specified.

In one example, the compound having a cyclic structure in its molecular structure can be exemplified by an alicyclic epoxy compound. For example, the compound can be exemplified by 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In one example, the structure of the compound comprising the oxetane group is not limited as long as it has the oxetane functional group, and for example, OXT-221, CHOX, OX-SC, OXT101, OXT121, OXT221 or OXT212 from TOAGOSEI, or EHO, OXBP, OXTP or OXMA from ETERNACOLL can be exemplified. Also, the linear or branched aliphatic epoxy compound can include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto.

In an embodiment of the present application, the encapsulating composition can further comprise a photoinitiator comprising an iodonium salt. The photoinitiator can be a cationic photopolymerization initiator. In addition, the photoinitiator can be a compound that absorbs a wavelength in a range of 200 nm to 400 nm.

As the photoinitiator, a known material in the art can be used, and for example, it can include a compound having a cation moiety comprising iodonium or aromatic iodonium and an anion moiety comprising $AsF_6^-$, $SbF_6^-$, $PF_6^-$, or tetrakis(pentafluorophenyl) borate. In one example, the encapsulating composition of the present application can comprise a photoinitiator comprising an iodonium salt as the photoinitiator in the above-mentioned specific composition, so as to be suitable for a use sealing an organic electronic element by an inkjet method. The encapsulating composition can realize excellent adhesive strength and curing sensitivity as well as processability as an ink composition, together with the epoxy compound and the oxetane group-containing compound in the above-mentioned specific content ratio.

In an embodiment of the present invention, the photoinitiator can be present in an amount of 1 to 15 parts by weight, 2 to 13 parts by weight, or 3 to 11 parts by weight relative to 100 parts by weight of the epoxy compound. By controlling the photoinitiator content range, the present application can minimize physical and chemical damage of an organic electronic element due to the nature of an encapsulating composition of the present application that is directly applied on the element.

In an embodiment of the present application, the encapsulating composition can further comprise a surfactant. In one example, the surfactant can comprise a polar functional group, and the polar functional group can be present at the compound structural end of the surfactant. The polar functional group can include, for example, a carboxyl group, a hydroxyl group, a phosphate, an ammonium salt, a carboxylate group, a sulfate or a sulfonate. Furthermore, in an embodiment of the present application, the surfactant can be a non-silicone-based surfactant or a fluorine-based surfactant. The non-silicone-based surfactant or the fluorine-based surfactant can be applied together with the above-mentioned epoxy compound and the compound having an oxetane group to provide excellent coating properties on the organic electronic element. On the other hand, in the case of a surfactant comprising a polar reactive group, it can have high affinity with the other components of the encapsulating composition, and thus participate in the curing reaction, thereby realizing an excellent effect in terms of adhesion. In an embodiment of the present application, a hydrophilic fluorine-based surfactant or non-silicone-based surfactant can be used to improve inkjet coating properties of a base material.

Specifically, the surfactant can be a polymer type or oligomer type fluorine-based surfactant. As the surfactant, a commercially available product can be used, which can be selected from the group consisting of Glide 100, Glide 110, Glide 130, Glide 460, Glide 440, Glide 450 or RAD 2500 from TEGO, Megaface F-251, F-281, F554, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant can be present in an amount of 0.1 to 10 parts by weight, 0.05 to 10 parts by weight, 0.1 to 10 parts by weight, 0.5 to 8 parts by weight or 1 to 4 parts by weight, relative to 100 parts by weight of the epoxy compound. Within the content range, the present application makes it possible that the encapsulating composition is applied to an inkjet method to form an organic layer of a thin film.

In an embodiment of the present application, the encapsulating composition can further comprise a photosensitizer in order to complement the curing property at a long wavelength activation energy beam of 300 nm or more. The photosensitizer can be a compound that absorbs a wavelength in a range of 200 nm to 400 nm.

The photosensitizer can be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzoyl-benzoate, 3,3-dimethyl-4-methoxybenzophenone and 3,3,4,4-tetra(t-butylperoxycarbonyl)-benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-proprenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethyl amino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H—Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer can be included in a range of 28 to 40 parts by weight, 31 to 38 parts by weight or 32 to 36 parts by weight, relative to 100 parts by weight of the photoinitiator. By controlling the content of the photosensitizer, the present invention can realize a synergistic action of curing sensitivity at a desired wavelength, and also prevent the photosensitizer from lowering the adhesion by not dissolving in the inkjet coating.

The encapsulating composition of the present application can further comprise a coupling agent. The present application can improve adhesiveness of a cured product of the encapsulating composition to an adherend or moisture transmission resistance of the cured product. The coupling agent can include, for example, a titanium-based coupling agent, an aluminum-based coupling agent, or a silane coupling agent.

In an embodiment of the present application, the silane coupling agent can include, specifically, an epoxy-based silane coupling agent such as 3-glycidyloxypropyl-trimethoxysilane, 3-glycidyloxypropyltriethoxysilane, 3-glycidyloxypropyl (dimethoxy)methylsilane and 2-(3,4-epoxycyclohexyl)ethyltrimethoxysilane; a mercapto-based silane coupling agent such as 3-mercaptopropyltrimethoxysilane, 3-mercaptopropyl-triethoxysilane, 3-mercaptopropyl-methyldimethoxysilane and 11-mercaptoundecyltrimethoxysilane; an amino-based silane coupling agent such as 3-aminopropyltrimethoxy-silane, 3-aminopropyl-triethoxysilane, 3-aminopropyldimethoxymethylsilane, N-phenyl-3-aminopropyltrimethoxy-silane, N-methyl-aminopropyltrimethoxysilane, N-(2-aminoethyl)-3-aminopropyltrimethoxy-silane and N-(2-aminoethyl)-3-aminopropyldimethoxymethylsilane; a ureide-based silane coupling agent such as 3-ureidepropyltriethoxysilane; a vinyl-based silane coupling agent such as vinyl-trimethoxysilane, vinyl-triethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilyl-propyl)disulfide and bis(triethoxysilyl-propyl)tetrasulfide; phenyltrimethoxysilane, methacryloxypropyltrimethoxysilane, imidazolesilane, triazinesilane, and the like.

In the present application, the coupling agent can be included in an amount of 0.1 to 10 parts by weight or 0.5 to 5 parts by weight, relative to 100 parts by weight of the epoxy compound. Within the above range, the present application can realize an effect of improving the adhesiveness by the addition of the coupling agent.

The encapsulating composition of the present application can comprise, if necessary, a moisture adsorbent. The term "moisture adsorbent" can be used to generically mean a component capable of adsorbing or removing moisture or humidity introduced from the outside through a physical or chemical reaction or the like. That is, it means a moisture-reactive adsorbent or a physical adsorbent, and a mixture thereof is also usable.

A specific kind of the usable moisture adsorbent in the present application is not particularly limited, which can include, for example, one or a mixture of two or more of a metal oxide, a metal salt or phosphorus pentoxide ($P_2O_5$), and the like, in the case of a moisture-reactive adsorbent, and can include zeolite, zirconia or montmorillonite, and the like, in the case of the physical adsorbent.

The encapsulating composition of the present application can comprise the moisture adsorbent in an amount of 5 parts by weight to 100 parts by weight, 5 to 80 parts by weight, 5 parts by weight to 70 parts by weight or 10 to 30 parts by weight, relative to 100 parts by weight of the epoxy compound. As the encapsulating composition of the present application preferably controls the content of the moisture adsorbent to 5 parts by weight or more, the present application can make the encapsulating composition or the cured product thereof exhibit excellent moisture and humidity barrier properties. In addition, by controlling the content of the moisture adsorbent to 100 parts by weight or less, the present application can provide a thin film sealing structure.

In one example, the encapsulating composition can further comprise an inorganic filler, if necessary. The specific type of the usable filler in the present application is not particularly limited, and for example, one or a mixture of two or more of clay, talc, alumina, calcium carbonate, silica, and the like can be used.

The encapsulating composition of the present application can comprise 0 to 50 parts by weight, 1 to 40 parts by weight, 1 to 20 parts by weight, or 1 to 10 parts by weight of inorganic filler, relative to 100 parts by weight of the epoxy compound. The present application can provide a sealing structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin film.

In addition to the above-mentioned constitutions, the encapsulating composition according to the present application can comprise various additives in the range without affecting the above-described effects of invention. For example, the encapsulating composition can comprise a defoamer, a tackifier, an ultraviolet stabilizer or an antioxidant and the like in an appropriate range of content depending on the desired physical properties.

In one example, the encapsulating composition can be in a liquid phase at room temperature, for example, at 15° C. to 35° C. or about 25° C. In an embodiment of the present application, the encapsulating composition can be in a solventless type liquid phase. The encapsulating composition can be applied to sealing an organic electronic element, and specifically, the encapsulating composition can be an ink composition that can be applied to seal the entire surface of the organic electronic element. The encapsulating composition of the present application can have a specific composition and physical properties so that ink-jetting can be performed.

[38] Furthermore, in an embodiment of the present application, the encapsulating composition can have a viscosity in a range of 50 cP or less, 1 to 46 cP, 3 to 44 cP, 4 to 38 cP, 5 to 33 cP or 14 to 24 cP, as measured by Brookfield's DV-3 at a temperature of 25° C., a torque of 90% and a shear rate of 100 rpm. By controlling the viscosity of the composition within the above range, the present application can realize physical properties that can be performed and increase coating properties, at the time of being applied to an organic electronic element, to provide a sealing material of a thin film.

In one example, the encapsulating composition can have a surface energy of the cured product after curing in a range of 5 mN/m to 45 mN/m, 10 mN/m to 40 mN/m, 15 mN/m to 35 mN/m, or 20 mN/m to 30 mN/m. The surface energy can be measured by a method known in the art, and for example, can be measured by a ring method. The present application can realize excellent coating properties in the above surface energy range.

In an embodiment of the present application, the surface energy ($\gamma^{surface}$, mN/m) can be calculated as $\gamma^{surface} = \gamma^{dispersion} + \gamma^{polar}$. In one example, the surface energy can be measured using a drop shape analyzer (DSA100 product from KRUSS). For example, after an encapsulating composition for measuring the surface energy is applied on a SiNx substrate to a thickness of about 50 μm and a coating area of 4 cm$^2$ (width: 2 cm, height: 2 cm) to form a sealing layer (spincoater), it is dried at room temperature for about 10 minutes under a nitrogen atmosphere and then UV-cured with an intensity of 1000 mW/cm$^2$ through a light quantity of 4000 mJ/cm$^2$. The process of dropping the deionized water whose surface tension is known on the layer after curing, and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane.

Also, in an embodiment of the present application, the encapsulating composition can have a light transmittance of 90% or more, 92% or more, or 95% or more in the visible light region after curing. Within the above range, the present application provides an organic electronic device having high-resolution, low power consumption and long-life by applying the encapsulating composition to a top emission type organic electronic device. Furthermore, the encapsulating composition of the present application can have a haze of 3% or less, 2% or less or 1% or less according to JIS K7105 standard test after curing, and the lower limit is not particularly limited, but can be 0%. Within the haze range, the encapsulating composition can have excellent optical properties after curing. In this specification, the above-mentioned light transmittance or haze can be measured in a state where the encapsulating composition is cured to an organic layer, and can be optical characteristics measured when the thickness of the organic layer is any one thickness of 2 μm to 50 μm. In an embodiment of the present application, in order to realize the optical characteristics, the above-mentioned moisture adsorbent or inorganic filler may not be included.

In one example, the encapsulating composition of the present application can have an amount of volatile organic compounds measured after curing of less than 50 ppm. In this specification, the volatile organic compound can be represented as outgas. The volatile organic compounds can be measured after curing the encapsulating composition and then holding a sample of the cured product at 110° C. for 30 minutes using Purge & Trap-gas chromatography/mass spectrometry. The measurement can be performed using a Purge & Trap sampler (JAI JTD-505 III)-GC/MS (Agilent 7890b/5977a) instrument.

In one example, the encapsulating composition of the present application can have a contact angle to glass of 30° or less, 25° or less, 20° or less, or 12° or less. The lower limit is not particularly limited, but can be 1° or 3° or more. By adjusting the contact angle to 30° or less, the present application can ensure spreadability in a short time in the inkjet coating, thereby forming an organic layer of a thin film. In the present application, the contact angle can be measured by applying a drop of the encapsulating composition onto glass using a sessile drop measurement method, which can be an average value measured after applying 5 times.

Figure 1:
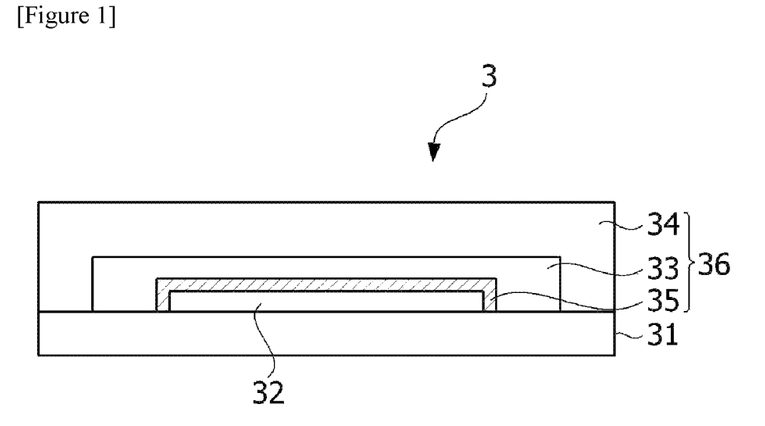
FIGS. 1 and 2 are cross-sectional views showing an organic electronic device according to one example of the present invention.

The present application also relates to an organic electronic device. As shown in FIG. 1, an exemplary organic electronic device (3) can comprise a substrate (31); an organic electronic element (32) formed on the substrate (31); and an organic layer (33) sealing the entire surface of the organic electronic element (32) and comprising the above-described encapsulating composition.

In an embodiment of the present application, the organic electronic element can comprise a first electrode layer, an organic layer formed on the first electrode layer and containing at least a light emitting layer, and a second electrode layer formed on the organic layer. The first electrode layer can be a transparent electrode layer or a reflective electrode layer, and the second electrode layer can also be a transparent electrode layer or a reflective electrode layer. More specifically, the organic electronic element can comprise a reflective electrode layer formed on a substrate, an organic layer formed on the reflective electrode layer and containing at least a light emitting layer, and a transparent electrode layer formed on the organic layer.

In the present application, the organic electronic element (23) can be an organic light emitting diode.

In one example, the organic electronic device according to the present application can be a top emission type, but is not limited thereto, and can be applied to a bottom emission type.

The organic electronic device can further comprise a protective layer (35) for protecting the electrodes and the light emitting layer of the organic electronic element. The protective layer can be an inorganic protective layer (35). The protective layer can be a protective layer by chemical vapor deposition (CVD), and the material can be the same as or different from the following inorganic layer, where a known inorganic material can be used. For example, as the protective layer, silicon nitride (SiNx) can be used. In one example, silicon nitride (SiNx) used as the protective layer can be deposited to a thickness of 0.01 μm to 50 μm.

In an embodiment of the present application, the organic electronic device (3) can further comprise an inorganic layer (34) formed on the organic layer (33). In one example, the inorganic layer can be one or more metal oxides, nitrides or oxynitrides selected from the group consisting of Al, Zr, Ti, Hf, Ta, In, Sn, Zn and Si. The inorganic layer can have a thickness of 0.01 μm to 50 μm or 0.1 μm to 20 μm or 1 μm to 10 In one example, the inorganic layer of the present application can be an inorganic material without any dopant, or can be an inorganic material containing a dopant. The dopant which can be doped can be one or more elements selected from the group consisting of Ga, Si, Ge, Al, Sn, Ge, B, In, Tl, Sc, V, Cr, Mn, Fe, Co and Ni, or an oxide of the element, but is not limited thereto.

In one example, the organic layer can have a thickness in a range of 2 μm to 20 μm, 2.5 μm to 15 and 2.8 μm to 9 μm. The present application can provide a thin-film organic electronic device by providing a thin organic layer.

The organic electronic device (3) of the present application can comprise a sealing structure comprising the organic layer (33) and the inorganic layer (34), as described above, where the sealing structure can comprise at least one or more organic layers and at least one or more inorganic layers, and the organic layer and the inorganic layer can be repeatedly laminated. For example, the organic electronic device can have a structure of substrate/organic electronic element/protective layer/(organic layer/inorganic layer)n, where n can be a number in a range of 1 to 100. FIG. 1 is a cross-sectional view exemplarily showing a case where n is 1.

In one example, the organic electronic device (3) of the present application can further comprise a cover substrate present on the organic layer (33). The material of the substrate and/or the cover substrate is not particularly limited, and a known material in the art can be used. For example, the substrate or the cover substrate can be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like can be used.

Figure 2:
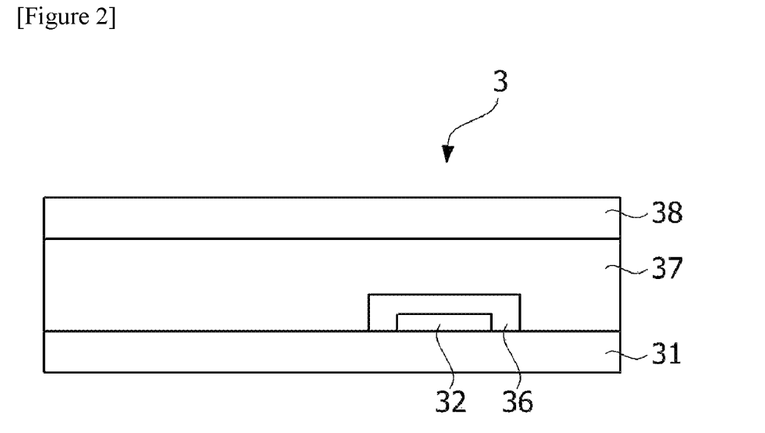

Also, as shown in FIG. 2, the organic electronic device (3) can further comprise an encapsulation film (37) existing between the cover substrate (38) and the substrate (31) on which the organic electronic element (32) is formed. The encapsulation film (37) can be applied as a use for attaching the substrate (31) on which the organic electronic element (32) is formed and the cover substrate (38), which can be, for example, a pressure-sensitive adhesive film or an adhesive film, but is not limited thereto. The encapsulation film (37) can seal the entire surface of the sealing structure (36) of the above-described organic layer and inorganic layer, laminated on the organic electronic element (32).

The present application also relates to a method for manufacturing an organic electronic device.

In one example, the manufacturing method can comprise a step of applying the above-described encapsulating composition on a substrate (31) in which an organic electronic element (32) is formed, so as to seal the entire surface of the organic electronic element (32), to form an organic layer (33).

Here, the organic electronic element (32) can be produced by forming a reflective electrode or a transparent electrode on a substrate (31) such as glass or a polymer film, as a substrate (31), by a method such as vacuum deposition or sputtering, and forming an organic material layer on the reflective electrode. The organic material layer can comprise a hole injecting layer, a hole transporting layer, a light emitting layer, an electron injecting layer, and/or an electron transporting layer. Subsequently, a second electrode is further formed on the organic material layer. The second electrode can be a transparent electrode or a reflective electrode.

The manufacturing method of the present application can further comprise a step of forming an inorganic layer (35) on the first electrode, the organic material layer and the second electrode, formed on the substrate (31). Then, the above-described organic layer (33) is applied to cover the entire surface of the organic electronic element (32) on the substrate (31). Here, the step of forming the organic layer (33) is not particularly limited and the above-described encapsulating composition can be applied to the entire surface of the substrate (31) using a process such as inkjet printing, gravure coating, spin coating, screen printing or reverse offset coating.

The manufacturing method can further comprise a step of irradiating the organic layer with light. In the present invention, a curing process can also be performed on an organic layer sealing an organic electronic device, and such a curing process can be performed, for example, in a heating chamber or a UV chamber, and preferably, can be performed in a UV chamber.

In one example, after the above-described encapsulating composition is applied to form an entire surface organic layer, the composition can be irradiated with light to induce cross-linking. The irradiation of light can comprise irradiating with light having a wavelength range of 250 nm to 450 nm or 300 nm to 450 nm region bands at a light quantity of 0.3 to 6 J/cm$^2$ or a light quantity of 0.5 to 5 J/cm$^2$.

In addition, the manufacturing method of the present application can further comprise a step of forming an inorganic layer (34) on the organic layer (33). As the step of forming an inorganic layer, a known method in the art can be used, which can be formed by chemical vapor deposition (CVD), as described above.

Advantageous Effects

The present application provides an encapsulating composition which can effectively block moisture or oxygen introduced into an organic electronic device from the outside to secure the lifetime of the organic electronic device, is possible to realize a top emission type organic electronic device, is applicable to an inkjet method and can provide a thin display, and an organic electronic device comprising the same.

EXPLANATION OF REFERENCE NUMERALS

3: organic electronic device
31: substrate
32: organic electronic element
33: organic layer
34: protective layer
35: inorganic layer
36: sealing structure
37: encapsulation film
38: cover substrate

BEST MODE

Hereinafter, the present invention will be described in more detail through Examples according to the present invention and Comparative Examples not complying with the present invention, but the scope of the present invention is not limited by the following examples.

Example 1

An alicyclic epoxy compound (Celloxide 2021P, Daicel Corp.) and an aliphatic epoxy compound (DE200, HAJIN CHEM TECH) as epoxy compounds, an oxetane group-containing compound (OXT-221 from TOAGOSEI), a photoinitiator comprising an iodonium salt (TTA-UV694 from Tetrachem, hereinafter, UV694) and a fluorine-based surfactant (F552 from DIC) were each introduced into a mixing vessel in a weight ratio of 23.8:28.7:37.5:5.0:1.0 (Celloxide2021P: DE200: OXT-221: UV694: F552) at room temperature.

In the mixing vessel, a uniform encapsulating composition ink was prepared using a planetary mixer (Kurabo, KK-250s).

Example 2

An encapsulating composition was prepared in the same manner as in Example 1, except that an alicyclic epoxy compound (Celloxide 2021P, Daicel Corp.) and an aliphatic epoxy compound (DE201, HAJIN CHEM TECH) as epoxy compounds, an oxetane group-containing compound (OXT-212 from TOAGOSEI), a photoinitiator comprising an iodonium salt (UV694) and a fluorine-based surfactant (FC-4430 from 3M) were each introduced into a mixing vessel in a weight ratio of 29.4:10.2:50.4:5.0:1.0 (Celloxide2021P: DE201: OXT-212: UV694: FC-4430) at room temperature.

Example 3

An encapsulating composition was prepared in the same manner as in Example 1, except that an alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI), a photoinitiator comprising an iodonium salt (UV694) and a fluorine-based surfactant (F552 from DIC) were each introduced into a mixing vessel in a weight ratio of 12.4:24.8:46.8:10.0:1.0 (Celloxide2021P: DE203: OXT-221: UV694: F552) at room temperature.

Example 4

An encapsulating composition was prepared in the same manner as in Example 1, except that an alicyclic epoxy compound (Celloxide 2081, Daicel Corp.) and an aliphatic epoxy compound (DE203, HAJIN CHEM TECH) as epoxy compounds, an oxetane group-containing compound (OXT-221 from TOAGOSEI), a photoinitiator comprising an iodonium salt (Irgacure 250 from BASF, hereinafter, 1250) and a fluorine-based surfactant (F552 from DIC) were each introduced into a mixing vessel in a weight ratio of 24.8:24.2:40.9:5.0:1.0 (Celloxide 2081: DE203: OXT-221: I250: F552) at room temperature.

Example 5

An encapsulating composition was prepared in the same manner as in Example 1, except that an alicyclic epoxy compound (Celloxide 3000, Daicel Corp.) and an aliphatic epoxy compound (DE207, HAJIN CHEM TECH) as epoxy compounds, an oxetane group-containing compound (OXT-221 from TOAGOSEI), a photoinitiator comprising an iodonium salt (1250) and a fluorine-based surfactant (F552 from DIC) were each introduced into a mixing vessel in a weight ratio of 30.0:7.2:52.8:5.0:1.0 (Celloxide 3000: DE207: OXT-221: I250: F552) at room temperature.

Example 6

An encapsulating composition was prepared in the same manner as in Example 1, except that an alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI), a photoinitiator comprising an iodonium salt (UV694) and a fluorine-based surfactant (F552 from DIC) were each introduced into a mixing vessel in a weight ratio of 37.5:7.0:45.5:5.0:1.0 (Celloxide2021P: DE203: OXT-221: UV694: F552) at room temperature.

Example 7

An encapsulating composition was prepared in the same manner as in Example 1, except that an alicyclic epoxy compound (Celloxide 2081P, Daicel Corp.) and an aliphatic epoxy compound (DE203, HAJIN CHEM TECH) as epoxy compounds, an oxetane group-containing compound (OXT-221 from TOAGOSEI), a photoinitiator comprising an iodonium salt (UV694) and a fluorine-based surfactant (F552 from DIC) were each introduced into a mixing vessel in a weight ratio of 20.0:41.0:29.0:5.0:1.0 (Celloxide 2081P: DE203: OXT-221: UV694: F552) at room temperature.

Comparative Example 1

An alicyclic epoxy compound (Celloxide 2021P, Daicel Corp.) and an aliphatic epoxy compound (DE213, HAJIN CHEM TECH) as epoxy compounds, an oxetane group-containing compound (OXT-121 from TOAGOSEI), a sulfonium salt-containing photoinitiator (Irgacure PAG 290 from BASF, hereinafter, I290) and a fluorine-based surfactant (F552 from DIC) were each introduced into a mixing vessel in a weight ratio of 2.3:23.4:64.3:5.0:1.0 (Celloxide2021P: DE213: OXT-121: I290: F552) at room temperature.

In the mixing vessel, a uniform encapsulating composition ink was prepared using a planetary mixer (Kurabo, KK-250s).

Comparative Example 2

An encapsulating composition was prepared in the same manner as in Comparative Example 1, except that an alicyclic epoxy compound (Celloxide 2021P, Daicel Corp.) and an aliphatic epoxy compound (DE201, HAJIN CHEM TECH) as epoxy compounds, an oxetane group-containing compound (OXT-221 from TOAGOSEI), a sulfonium salt-containing photoinitiator (TTA-UV692 from Tetrachem, hereinafter, UV692) and a fluorine-based surfactant (F552 from DIC) were each introduced into a mixing vessel in a weight ratio of 23.8:30.0:36.2:5.0:1.0 (Celloxide2021P: DE201: OXT-221: UV692: F552) at room temperature.

Comparative Example 3

An encapsulating composition was prepared in the same manner as in Comparative Example 1, except that an alicyclic epoxy compound (Celloxide 2021P, Daicel Corp.) and an aliphatic epoxy compound (DE201, HAJIN CHEM TECH) as epoxy compounds, an oxetane group-containing compound (OXT-212 from TOAGOSEI), a sulfonium salt-containing photoinitiator (GSID26-1 from BASF) and a fluorine-based surfactant (F552 from DIC) were each introduced into a mixing vessel in a weight ratio of 29.4:10.2:50.4:5.0:1.0 (Celloxide2021P: DE201: OXT-212: GSID26-1: F552) at room temperature.

Comparative Example 4

An encapsulating composition was prepared in the same manner as in Comparative Example 1, except that an alicyclic epoxy compound (Celloxide 2021P, Daicel Corp.) and an aliphatic epoxy compound (DE207, HAJIN CHEM TECH) as epoxy compounds, an oxetane group-containing compound (OXT-212 from TOAGOSEI), a non-ionic photoinitiator (Irgacure PAG 103 from BASF, hereinafter, PAG103) and a fluorine-based surfactant (F552 from DIC) were each introduced into a mixing vessel in a weight ratio of 29.4:10.2:50.4:5.0:1.0 (Celloxide2021P: DE207: OXT-212: PAG103: F552) at room temperature.

Comparative Example 5

An encapsulating composition was prepared in the same manner as in Comparative Example 1, except that an alicyclic epoxy compound (Celloxide 2021P, Daicel Corp.) and an aliphatic epoxy compound (DE207, HAJIN CHEM TECH) as epoxy compounds, an oxetane group-containing compound (OXT-212 from TOAGOSEI), a non-ionic photoinitiator (CGI725 from BASF) and a fluorine-based surfactant (F552 from DIC) were each introduced into a mixing vessel in a weight ratio of 29.4:10.2:50.4:5.0:1.0 (Celloxide2021P: DE207: OXT-212: CGI725: F552) at room temperature.

Comparative Example 6

An encapsulating composition was prepared in the same manner as in Comparative Example 1, except that an alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI), a photoinitiator comprising an iodonium salt (UV694) and a fluorine-based surfactant (F552 from DIC) were each introduced into a mixing vessel in a weight ratio of 12.5:7.3:66.7:5.0:1.0 (Celloxide2021P: DE203: OXT-221: UV694: F552) at room temperature.

Physical properties in Examples and Comparative Examples were evaluated in the following manner.

1. Viscosity Measurement

Each viscosity of the encapsulating compositions prepared in Examples and Comparative Examples was measured using DV-3 as a Brookfield viscometer as follows.

The viscosity of the prepared encapsulating composition was measured under conditions of a temperature of 25° C., a torque of 90% and a shear rate of 100 rpm. Specifically, 0.5 ml of a sample was injected using a cone/plate method of the Brookfield viscometer to measure the viscosity.

2. Curing Sensitivity Measurement

The encapsulating compositions prepared in Examples and Comparative Examples were each irradiated with UV of 1 J/cm$^2$ at an intensity of 1000 mW/cm$^2$ and then the tack free time of each sealing material was measured. First, the encapsulating composition is applied by spin coating to a thickness of 10 μm and cured. A time until a tacky feeling disappears and there is no leakage of the sealing material when the surface of the sealing material has been touched immediately after curing, is defined as a tack free time and measured. It was measured by dividing the relative humidity at 5%, 25% and 50%. It was classified as ⊚ in the case where the tack free time was less than 1 second, as O in the case where it was less than 1 minute, as Δ in the case where it was 5 minutes or more and as X in the case where it was 30 minutes or more.

3. Upper Adhesion Measurement

The encapsulating compositions prepared in Examples and Comparative Examples were each spin-coated on an LCD glass to a thickness of 5 μm. The coated encapsulating composition was irradiated with UV of 1 J/cm' at an intensity of 1000 mW/cm$^2$ under a condition of 5% relative humidity. An adhesive strength was measured using TA-/XT/PLUS as a texture analyzer from STABLE MICRO SYSTEMS. The adhesive strength was measured according to ASTM D-3330 standard. The measurement was performed ten times, where since there was a measurement error in the measured value, the ranges were set for each section and indicated in Table 1.

4. Lower Adhesive Strength

The encapsulating compositions prepared in Examples and Comparative Examples were each spin-coated on an LCD glass to a thickness of 5 μm. The coated encapsulating composition was irradiated with UV of 1 J/cm' at an intensity of 1000 mW/cm$^2$ under a condition of 5% relative humidity. The cured encapsulating composition was subjected to a cross cut test according to ASTM D3359 standard.

Specifically, a Nichiban Tape CT-24 (width 2 cm) was used, and a specimen was cut with a knife at a distance of 1 mm in transverse and longitudinal directions by 11 lines, respectively, to form 100 square lattices with a width of 1 mm and a length of 1 mm. Thereafter, when the CT-24 adhesive tape from Nichiban Co., Ltd. was attached to the cut surface and then peeled off, the state of the peeling faces together was measured and evaluated according to the following criteria.

<Cross-Hatch Adhesive Force Evaluation Criteria>

5B: if there is no peeled face
4B: if the peeled faces are within 5% relative to the total area
3B: if the peeled faces are more than 5% and within 15% relative to the total area
2B: if the peeled faces are more than 15% and within 35% relative to the total area
1B: if the peeled faces are more than 35% and within 65% relative to the total area
0B: if the peeled faces are more than 60% relative to the total area

TABLE 1

| | Viscosity (cPs) | Curing sensitivity | | | Upper adhesion (gf/inch) | Lower adhesion |
| --- | --- | --- | --- | --- | --- | --- |
| | | 5% RH | 25% RH | 50% RH | | |
| Example 1 | 33.6 | ⊚ | ⊚ | ⊚ | 900~1000 | 5B |
| Example 2 | 21.8 | ⊚ | ⊚ | ⊚ | 700~800 | 5B |
| Example 3 | 17 | ⊚ | ⊚ | ○ | 800~900 | 4B |
| Example 4 | 35.8 | ⊚ | ⊚ | ○ | 800~900 | 5B |
| Example 5 | 10.9 | ⊚ | ⊚ | ○ | 700~800 | 5B |
| Example 6 | 70 | ⊚ | ⊚ | ⊚ | 700~800 | 5B |
| Example 7 | 46 | ⊚ | ⊚ | ⊚ | 800~900 | 4B |
| Comparative Example 1 | 90.3 | ⊚ | Δ | Δ | 500~600 | 3B |
| Comparative Example 2 | 33.8 | ○ | Δ | X | 200~300 | 2B |
| Comparative Example 3 | 21.8 | Δ | X | X | 100~200 | 2B |
| Comparative Example 4 | 21.8 | Δ | Δ | X | 100~200 | 2B |
| Comparative Example 5 | 21.8 | ○ | Δ | X | 200~300 | 1B |
| Comparative Example 6 | 14.2 | Δ | X | X | 100~200 | 0B |

The invention claimed is:

1. An organic electronic device, comprising:
a substrate;
an organic electronic element formed on the substrate; and
an organic layer sealing the entire surface of the organic electronic element and comprising an encapsulating composition that comprises:
an epoxy compound comprising:
an alicyclic epoxy compound; and
a linear or branched aliphatic epoxy compound having at least bifunctionality or more selected from among 1,4-butanediol diglycidyl ether, ethylene glycol diglycidyl ether, 1,6-hexanediol diglycidyl ether, propylene glycol diglycidyl ether, diethylene glycol diglycidyl ether, and neopentyl glycol diglycidyl ether, wherein the linear or branched aliphatic epoxy compound having at least bifunctionality or more is present in an amount of 20 to 60 parts by weight or 173 to 205 parts by weight relative to 100 parts by weight of the alicyclic epoxy compound;
a compound having an oxetane group and a boiling point in a range of 110 to 300° C. present in an amount of 45 parts by weight to 145 parts by weight relative to 100 parts by weight of the total epoxy compounds present in the composition;
a surfactant comprising a fluorine-based compound having a polar functional group which is present at the end of the surfactant, wherein the polar functional group is a carboxyl group, a hydroxyl group, a phosphate, an ammonium salt, a carboxylate group, a sulfate, or a sulfonate; and
a photoinitiator comprising an iodonium salt,
wherein the composition has a viscosity of 50 cP or less, as measured at a temperature of 25° C., a torque of 90% and a shear rate of 100 rpm.

2. The organic electronic device according to claim 1, wherein the alicyclic epoxy compound includes a ring having from 3 to 10 ring constituent atoms.

3. The organic electronic device according to claim 1, wherein the alicyclic epoxy compound or the linear or branched aliphatic epoxy compound has an epoxy equivalent in a range of 50 to 350 g/eq.

4. The organic electronic device according to claim 1, wherein the compound having an oxetane group has a weight average molecular weight in a range of 150 to 1,000 g/mol.

5. The organic electronic device according to claim 1, wherein the photoinitiator is present in an amount of 1 to 15 parts by weight relative to 100 parts by weight of the epoxy compound.

6. The organic electronic device according to claim 1, wherein the surfactant is present in an amount of 0.01 to 10 parts by weight relative to 100 parts by weight of the epoxy compound.

7. The organic electronic device according to claim 1, wherein the composition is a solventless ink composition.

8. A method for manufacturing an organic electronic device of claim 1, comprising applying the encapsulating composition on the substrate on which the organic electronic element is formed, sealing the entire surface of the organic electronic element, and forming an organic layer.

9. The method of claim 8, wherein the applying comprises inkjet printing, gravure coating, spin coating, screen printing or reverse offset coating.

* * * * *